US011575039B2

(12) United States Patent
Shiraishi et al.

(10) Patent No.: US 11,575,039 B2
(45) Date of Patent: Feb. 7, 2023

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Tatsuya Shiraishi, Nonoichi Ishikawa (JP); Masaharu Shimabayashi, Kanazawa Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 174 days.

(21) Appl. No.: 17/012,160

(22) Filed: Sep. 4, 2020

(65) Prior Publication Data
US 2021/0296490 A1     Sep. 23, 2021

(30) Foreign Application Priority Data

Mar. 19, 2020   (JP) .............................. JP2020-050006

(51) Int. Cl.
*H01L 29/78*     (2006.01)
*H01L 29/40*     (2006.01)
(Continued)

(52) U.S. Cl.
CPC ........ *H01L 29/7813* (2013.01); *H01L 29/401* (2013.01); *H01L 29/42364* (2013.01);
(Continued)

(58) Field of Classification Search
CPC ........... H01L 29/7813; H01L 29/42364; H01L 29/511; H01L 29/407; H01L 21/28202
See application file for complete search history.

(56) References Cited

U.S. PATENT DOCUMENTS 8,981,462 B2    3/2015 Nozu
9,337,283 B2    5/2016 Nishiguchi
(Continued)

FOREIGN PATENT DOCUMENTS

JP    2007-535822 A    12/2007
JP    5799046 B2    10/2015
(Continued)

*Primary Examiner* — Fernando L Toledo
*Assistant Examiner* — Valerie N Newton
(74) *Attorney, Agent, or Firm* — Allen & Overy LLP (57) ABSTRACT

A semiconductor device includes: a first electrode; a first semiconductor layer of first conductivity type provided on the first electrode; a second semiconductor layer of first conductivity type provided on the first semiconductor layer; a first semiconductor region of second conductivity type provided on the second semiconductor layer; a second semiconductor region of second conductivity type provided on the second semiconductor layer; a first insulating film provided in a trench between the first semiconductor region and the second semiconductor region, the trench reaching the second semiconductor layer from above the first semiconductor region and the second semiconductor region, the first insulating film containing silicon oxide; a second electrode provided in the trench, the second electrode facing the second semiconductor layer via the first insulating film, the second electrode containing polysilicon; a third electrode provided above the second electrode, the third electrode facing the first semiconductor region and the second semiconductor region via a second insulating film containing silicon oxide; a third insulating film provided between the second electrode and the third electrode, the third insulating film containing silicon nitride; a third semiconductor region of first conductivity type provided on the first semiconductor region; a fourth semiconductor region of first conductivity type provided on the second semiconductor region; an interlayer insulating film provided on the third electrode;
(Continued)

and a fourth electrode provided on the interlayer insulating film, the fourth electrode being electrically connected to the third semiconductor region and the fourth semiconductor region.

11 Claims, 10 Drawing Sheets

(51) Int. Cl.
    *H01L 29/423*     (2006.01)
    *H01L 29/51*     (2006.01)
    *H01L 21/02*     (2006.01)
    *H01L 21/28*     (2006.01)
    *H01L 29/16*     (2006.01)

(52) U.S. Cl.
    CPC ........ *H01L 29/511* (2013.01); *H01L 21/0217* (2013.01); *H01L 21/02271* (2013.01); *H01L 21/28202* (2013.01); *H01L 29/16* (2013.01); *H01L 29/407* (2013.01); *H01L 29/518* (2013.01)

(56) References Cited

U.S. PATENT DOCUMENTS

| | | | |
|---|---|---|---|
| 10,121,892 | B2 | 11/2018 | Nishiwaki |
| 2005/0242392 | A1 | 11/2005 | Pattanayak et al. |
| 2012/0313161 | A1 | 12/2012 | Grivna et al. |
| 2018/0226480 | A1 | 8/2018 | Okuda et al. |
| 2020/0273987 | A1* | 8/2020 | Zeng ................. H01L 29/66734 |
| 2021/0057573 | A1* | 2/2021 | Shimomura .......... H01L 29/407 |

FOREIGN PATENT DOCUMENTS

| | | |
|---|---|---|
| JP | 5902116 B2 | 4/2016 |
| JP | 2018-129378 A | 8/2018 |
| JP | 6426642 B2 | 11/2018 |

\* cited by examiner

SEMICONDUCTOR DEVICE

CROSS-REFERENCE TO RELATED APPLICATION

This application is based upon and claims the benefit of priority from Japanese Patent Application No. 2020-050006, filed on Mar. 19, 2020, the entire contents of which are incorporated herein by reference.

FIELD

Embodiments described herein relate generally to a semiconductor device.

BACKGROUND

A semiconductor device such as a metal oxide semiconductor field effect transistor (MOSFET) is used for power conversion and the like. Such a semiconductor device preferably has a low on-resistance.

DETAILED DESCRIPTION

Hereinafter, embodiments of the present disclosure will be described with reference to the drawings. Note that in the following description, the same members and the like are denoted by the same reference numerals, and description of members and the like once described is appropriately omitted.

Here, upward in the drawings is described as "up", and downward in the drawings is described as "down" in order to indicate a positional relationship of parts and the like. Here, the terms "up" and "down" do not necessarily indicate a relationship with the direction of gravity.

Hereinafter, a case where a first conductivity type is n-type and a second conductivity type is p-type will be exemplified.

In the following description, notations of $n^+$, n, $n^-$, $p^+$, p, and $p^-$ indicate a relative level of an impurity concentration of each of the conductivity types. That is, $n^+$ indicates that an impurity concentration of n-type is relatively higher than n, and $n^-$ indicates that the impurity concentration of n-type is relatively lower than n. $p^+$ indicates that an impurity concentration of p-type is relatively higher than p, and $p^-$ indicates that the impurity concentration of p-type is relatively lower than p. Note that $n^+$ type and $n^-$ type may be simply referred to as n type, and $p^+$ type and $p^-$ type may be simply referred to as p type.

First Embodiment

A semiconductor device according to the present embodiment includes: a first electrode; a first semiconductor layer of first conductivity type provided on the first electrode; a second semiconductor layer of first conductivity type provided on the first semiconductor layer; a first semiconductor region of second conductivity type provided on the second semiconductor layer; a second semiconductor region of second conductivity type provided on the second semiconductor layer; a first insulating film provided in a trench between the first semiconductor region and the second semiconductor region, the trench reaching the second semiconductor layer from above the first semiconductor region and the second semiconductor region, the first insulating film containing silicon oxide; a second electrode provided in the trench, the second electrode facing the second semiconductor layer via the first insulating film, the second electrode containing polysilicon; a third electrode provided above the second electrode, the third electrode facing the first semiconductor region and the second semiconductor region via a second insulating film containing silicon oxide; a third insulating film provided between the second electrode and the third electrode, the third insulating film containing silicon nitride; a third semiconductor region of first conductivity type provided on the first semiconductor region; a fourth semiconductor region of first conductivity type provided on the second semiconductor region; an interlayer insulating film provided on the third electrode; and a fourth electrode provided on the interlayer insulating film, the fourth electrode being electrically connected to the third semiconductor region and the fourth semiconductor region.

Figure 1:
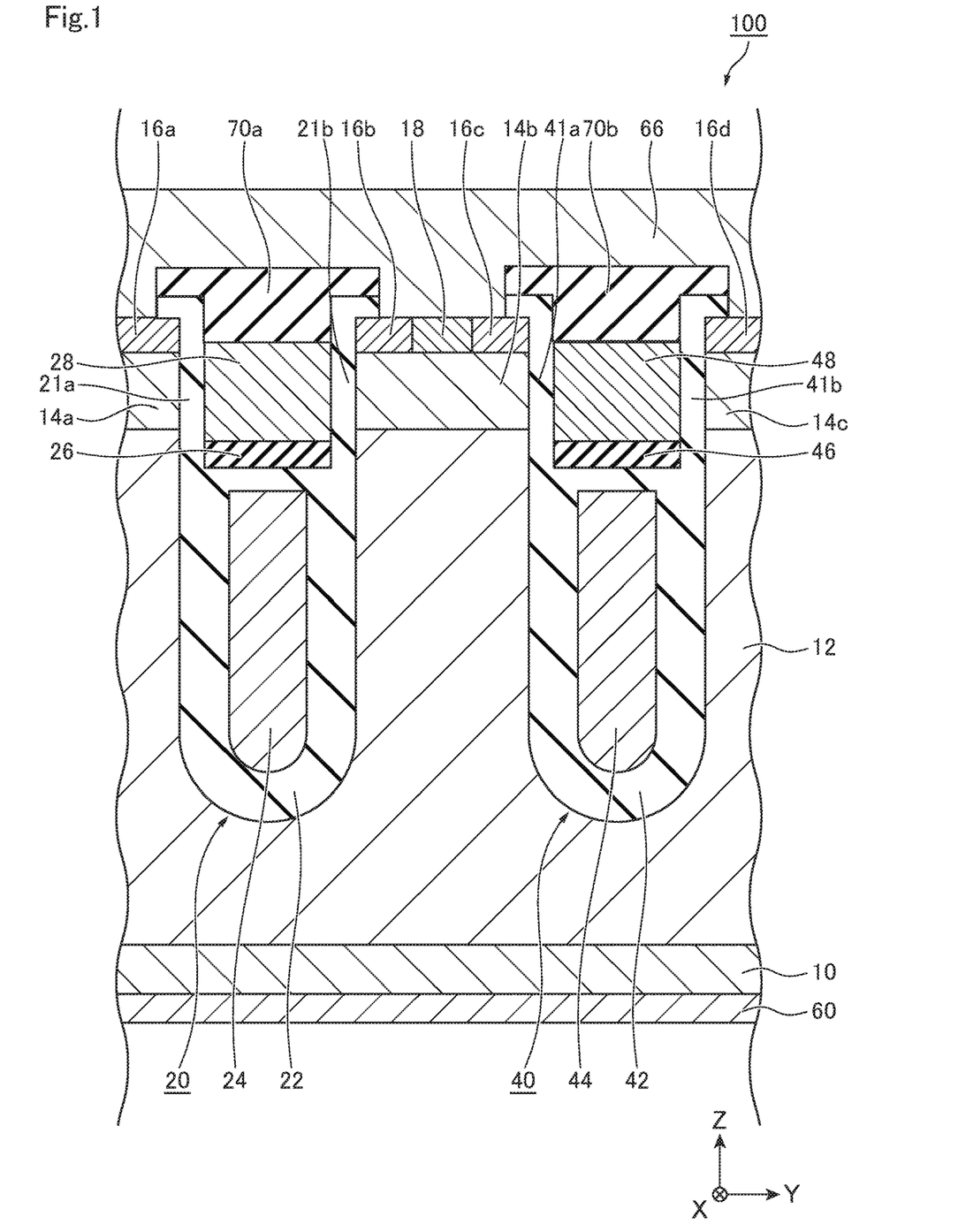
FIG. 1 is a schematic cross-sectional view of a semiconductor device according to a first embodiment.

FIG. 1 is a schematic cross-sectional view of a semiconductor device 100 according to the present embodiment. The semiconductor device 100 is, for example, a vertical MOSFET.

The semiconductor device 100 includes a drain layer 10, a drift layer 12, a base region 14, a source region 16, a contact region 18, a first trench 20, a second insulating film 21, a first insulating film 22, a first field plate electrode 24, a third insulating film 26, a first gate electrode 28, a second trench 40, a sixth insulating film 41, a fifth insulating film 42, a second field plate electrode 44, a seventh insulating film 46, a second gate electrode 48, a drain electrode 60, a source electrode 66, and an interlayer insulating film 70.

Note that the drain layer 10 is an example of the first semiconductor layer. The drift layer 12 is an example of the second semiconductor layer. A base region 14a as the base region 14 is an example of the first semiconductor region. A base region 14b as the base region 14 is an example of the second semiconductor region. A source region 16a as the source region 16 is an example of the third semiconductor region. A source region 16b as the source region 16 is an example of the fourth semiconductor region. The first trench 20 is an example of the trench. The drain electrode 60 is an example of the first electrode. The first field plate electrode 24 is an example of a field plate electrode or the second electrode. The first gate electrode 28 is an example of a gate electrode or the third electrode. The source electrode 66 is an example of the fourth electrode.

The drain layer 10 functions as a drain of the MOSFET. The drain layer 10 contains, for example, a semiconductor material of $n^+$ type.

The drain electrode 60 is provided under the drain layer 10 and is electrically connected to the drain layer 10. The drain electrode 60 functions as a drain electrode of the MOSFET.

The drift layer 12 is provided on the drain layer 10. The drift layer 12 functions as a drift layer of the MOSFET. The drift layer 12 contains, for example, a semiconductor material of $n^-$ type.

Here, an X direction, a Y direction perpendicular to the X direction, and a Z direction perpendicular to the X direction and the Y direction are defined. The drain layer 10 and the drift layer 12 are provided parallel to an XY plane parallel to the X direction and the Y direction. The Z direction is a direction in which the drain layer 10 and the drift layer 12 are stacked.

The base region 14 is provided on the drift layer 12. The base region 14 functions as a base of the MOSFET. The base region 14 forms a channel and allows carriers to flow between the source region 16 and the drain layer 10 when a voltage is applied to the first gate electrode 28 or the second gate electrode 48. The base region 14 contains, for example, a p-type semiconductor material. The semiconductor device 100 has base regions 14a, 14b, and 14c as the base region 14.

The source region 16 is provided on the base region 14. The source region 16 functions as a source of the MOSFET. When an appropriate voltage is applied to the first gate electrode 28 or the second gate electrode 48, carriers flow between the source region 16 and the drain layer 10. The source region 16 contains, for example, a semiconductor material of $n^+$ type. The semiconductor device 100 has source regions 16a, 16b, 16c, and 16d as the source region 16.

The contact region 18 is provided on the base region 14 and is electrically connected to the base region 14 and the source region 16. The contact region 18 is provided in order to improve electrical contact of the base region 14 and the source region 16 with the source electrode 66. The contact region 18 contains, for example, a $p^+$ type semiconductor material. Note that the contact region 18 is provided on the base region 14b in FIG. 1. However, the contact region 18 may be further provided on the base region 14a and the base region 14c.

The first trench 20 is provided so as to reach the drift layer 12 from above the source region 16.

The first insulating film 22 is provided in the first trench 20. For example, the first insulating film 22 is provided so as to cover the first field plate electrode 24. For example, the first insulating film 22 is provided between the first field plate electrode 24 and the first gate electrode 28. However, the form of the first insulating film 22 is not limited to this form. The first insulating film 22 contains silicon oxide (SiOx). However, a material contained in the first insulating film 22 is not limited to SiOx. For example, the first insulating film 22 is formed by a thermal oxidation method or chemical vapor deposition (CVD).

The second insulating film 21 is provided on the first insulating film 22 in the first trench 20. A second insulating film 21a as the second insulating film 21 is provided between the base region 14a and the first gate electrode 28 and between an interlayer insulating film 70a and the source region 16a. A second insulating film 21b as the second insulating film 21 is provided between the base region 14b and the first gate electrode 28 and between the interlayer insulating film 70a and the source region 16b. The second insulating film 21 contains silicon oxide (SiOx). However, a material contained in the second insulating film 21 is not limited to SiOx. For example, the second insulating film 21 is formed by a thermal oxidation method or CVD. Note that the second insulating film 21 may be formed simultaneously in the same step as the first insulating film 22, or may be formed in a different step.

The first field plate electrode 24 is provided in the first trench 20 so as to face the drift layer 12 via the first insulating film 22. For example, the first field plate electrode 24 is provided alongside the drift layer 12. The first field plate electrode 24 is provided, for example, in order to make an electric field distribution in a drift layer in a trench depth direction close to a flat shape to increase a breakdown voltage. The first field plate electrode 24 has, for example, a portion extending upward in a portion (not illustrated) provided in the depth direction of FIG. 1. The first field plate electrode 24 is electrically connected to the source electrode 66 using the upwardly extending portion. Note that how to connect the first field plate electrode 24 to the source electrode 66 is not limited to this connecting method.

The first gate electrode 28 is provided above the first field plate electrode 24 between the base region 14a and the base region 14b via the second insulating film 21. The first gate electrode 28 functions as a gate of the MOSFET.

The third insulating film 26 is provided between the first field plate electrode 24 and the first gate electrode 28. The third insulating film 26 contains silicon nitride (SiNx). However, a material contained in the third insulating film 26 is not limited to SiNx. The third insulating film 26 preferably has a film thickness of 10 nm or more. The third insulating film 26 is preferably formed by, for example, an LPCVD method. However, how to form the third insulating film 26 is not limited to this method.

The second trench 40 is provided so as to reach the drift layer 12 from above the source region 16.

The fifth insulating film 42 is provided in the second trench 40. For example, the fifth insulating film 42 is provided so as to cover the second field plate electrode 44. For example, the fifth insulating film 42 is provided between the second field plate electrode 44 and the second gate electrode 48. However, the form of the fifth insulating film 42 is not limited to this form. The fifth insulating film 42 contains silicon oxide (SiOx). However, a material contained in the fifth insulating film 42 is not limited to SiOx. For example, the fifth insulating film 42 is formed by a thermal oxidation method or chemical vapor deposition (CVD).

The sixth insulating film 41 is provided on the fifth insulating film 42 in the second trench 40. A sixth insulating film 41a as the sixth insulating film 41 is provided between the base region 14b and the second gate electrode 48 and between the interlayer insulating film 70b and the source region 16c. A sixth insulating film 41b as the sixth insulating film 41 is provided between the base region 14c and the second gate electrode 48 and between the interlayer insulating film 70b and the source region 16d. The sixth insulating film 41 contains silicon oxide (SiOx). However, a material contained in the sixth insulating film 41 is not limited to SiOx. For example, the sixth insulating film 41 is formed by a thermal oxidation method or CVD. Note that the sixth insulating film 41 may be formed simultaneously in the same step as the fifth insulating film 42, or may be formed in a different step.

The second field plate electrode 44 is provided in the second trench 40 so as to face the drift layer 12 via the fifth insulating film 42. For example, the second field plate electrode 44 is provided alongside the drift layer 12. The second field plate electrode 44 is provided, for example, in order to make an electric field distribution in a drift layer in a trench depth direction close to a flat shape to increase a breakdown voltage. The second field plate electrode 44 has, for example, a portion extending upward in a portion (not illustrated) provided in the depth direction of FIG. 1. The second field plate electrode 44 is electrically connected to the source electrode 66 using the upwardly extending portion. Note that how to connect the second field plate electrode 44 to the source electrode 66 is not limited to this connecting method.

The second gate electrode 48 is provided above the second field plate electrode 44 between the base region 14b and the base region 14c via the sixth insulating film 41. The second gate electrode 48 functions as a gate of the MOSFET.

The seventh insulating film 46 is provided between the second field plate electrode 44 and the second gate electrode 48. The seventh insulating film 46 contains silicon nitride (SiNx). However, a material contained in the seventh insulating film 46 is not limited to SiNx. The seventh insulating film 46 preferably has a film thickness of 10 nm or more.

An interlayer insulating film 70a as the interlayer insulating film 70 is provided above the source region 16a and the source region 16b, and is provided on the first gate electrode 28 and the second insulating film 21. An interlayer insulating film 70b as the interlayer insulating film 70 is provided above the source region 16c and the source region 16d, and is provided on the second gate electrode 48 and the sixth insulating film 41. The interlayer insulating film 70 contains, for example, SiOx. However, a material contained in the interlayer insulating film 70 is not limited to SiOx.

Examples of a semiconductor material used for the drain layer 10, the drift layer 12, the base region 14, and the source region 16 include silicon (Si). However, the semiconductor material used for the drain layer 10, the drift layer 12, the base region 14, and the source region 16 may be another semiconductor material such as silicon carbide (SiC), gallium nitride (GaN), or gallium arsenide (GaAs).

When Si is used as the semiconductor material, for example, arsenic (As), phosphorus (P), or antimony (Sb) can be used as n-type impurities, and boron (B) can be used as p-type impurities.

The first field plate electrode 24 and the second field plate electrode 44 each contain a conductive material such as polysilicon containing impurities of conductivity type.

The first gate electrode 28 and the second gate electrode 48 each contain a conductive material such as polysilicon containing impurities of conductivity type. The drain electrode 60 and the source electrode 66 each contain a conductive material such as metal.

When the first field plate electrode 24 and the second field plate electrode 44 each contain impurities of conductivity type, the first field plate electrode 24 and the second field plate electrode 44 each preferably contain the impurities of conductivity type at a concentration of $1\times10^{19}$ atoms/cm$^3$ or more and $1\times10^{22}$ atoms/cm$^3$ or less.

Figure 2:
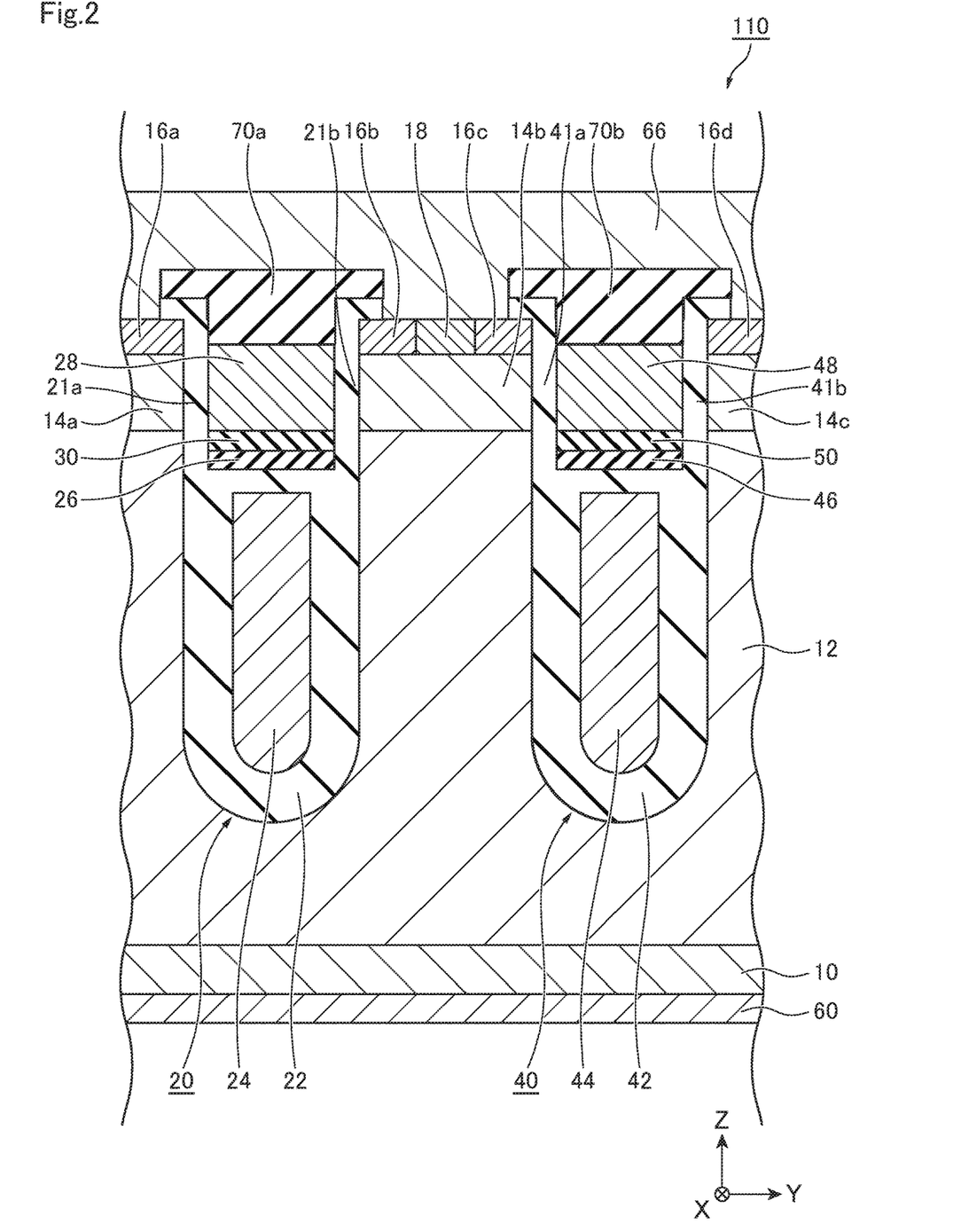
FIG. 2 is a schematic cross-sectional view of a semiconductor device according to another aspect of the first embodiment.

FIG. 2 is a schematic cross-sectional view of a semiconductor device 110 according to another aspect of the present embodiment. In the semiconductor device 110, a fourth insulating film 30 containing, for example, SiOx is provided between the first gate electrode 28 and the third insulating film 26. An eighth insulating film 50 containing, for example, SiOx is provided between the second gate electrode 48 and the seventh insulating film 46. The fourth insulating film 30 and the eighth insulating film 50 can be formed by, for example, oxidizing upper surfaces of the third insulating film 26 and the seventh insulating film 46, respectively. However, a method for manufacturing the fourth insulating film 30 and the eighth insulating film 50 is not limited to this method.

Figure 3:
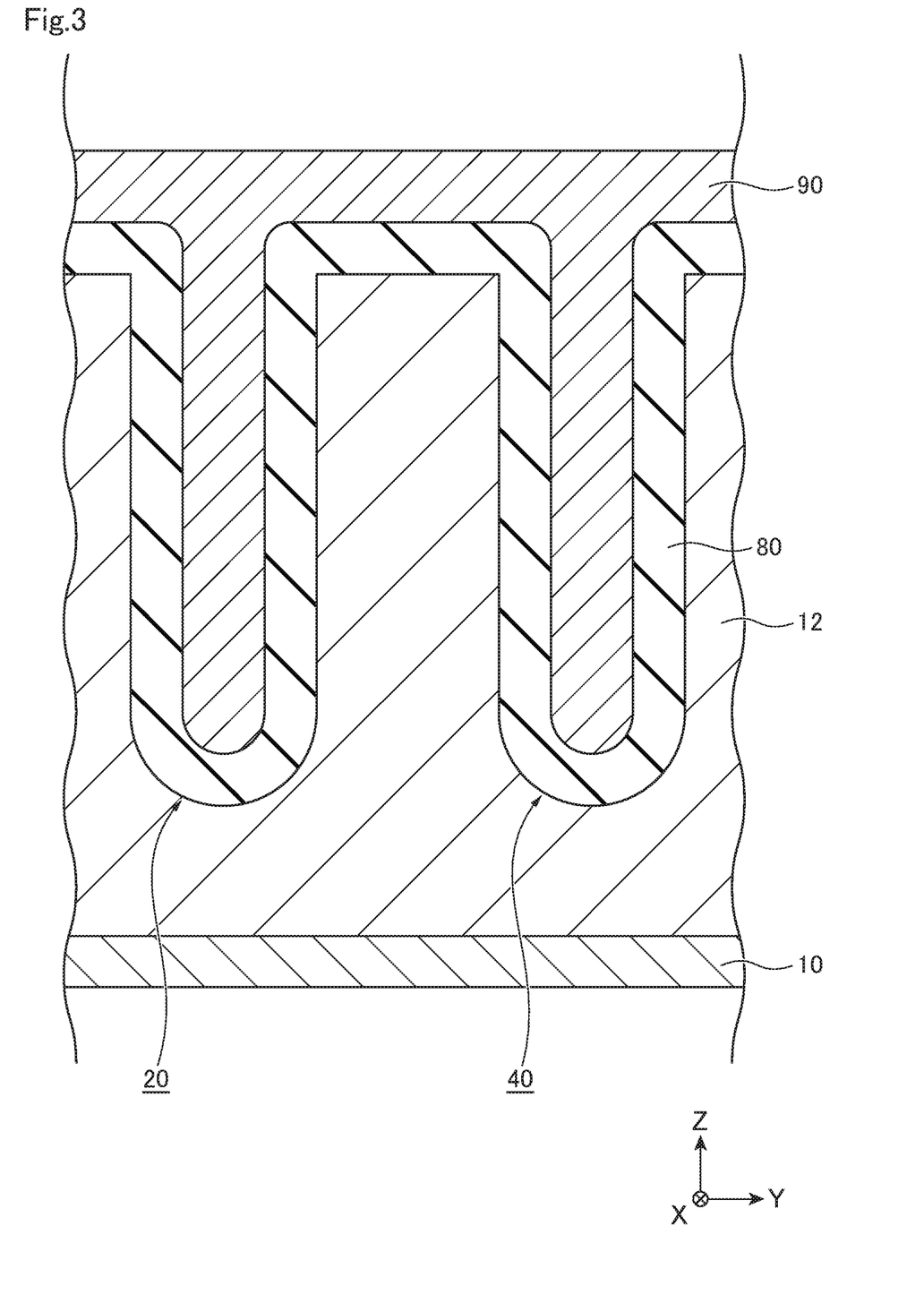
FIG. 3 is a schematic cross-sectional view illustrating a process of manufacturing the semiconductor device according to the first embodiment.
Figure 4:
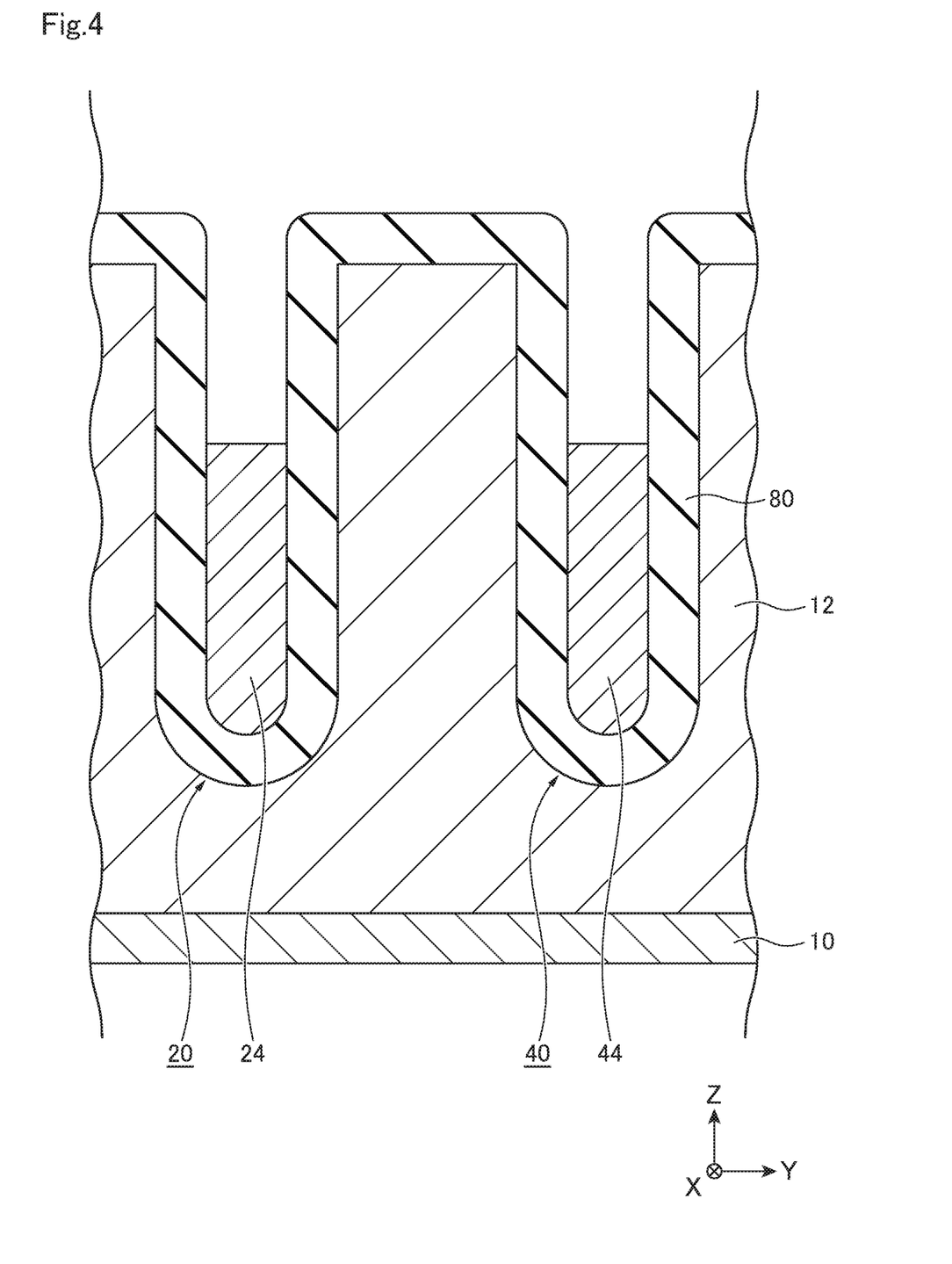
FIG. 4 is a schematic cross-sectional view illustrating the process of manufacturing the semiconductor device according to the first embodiment.
Figure 5:
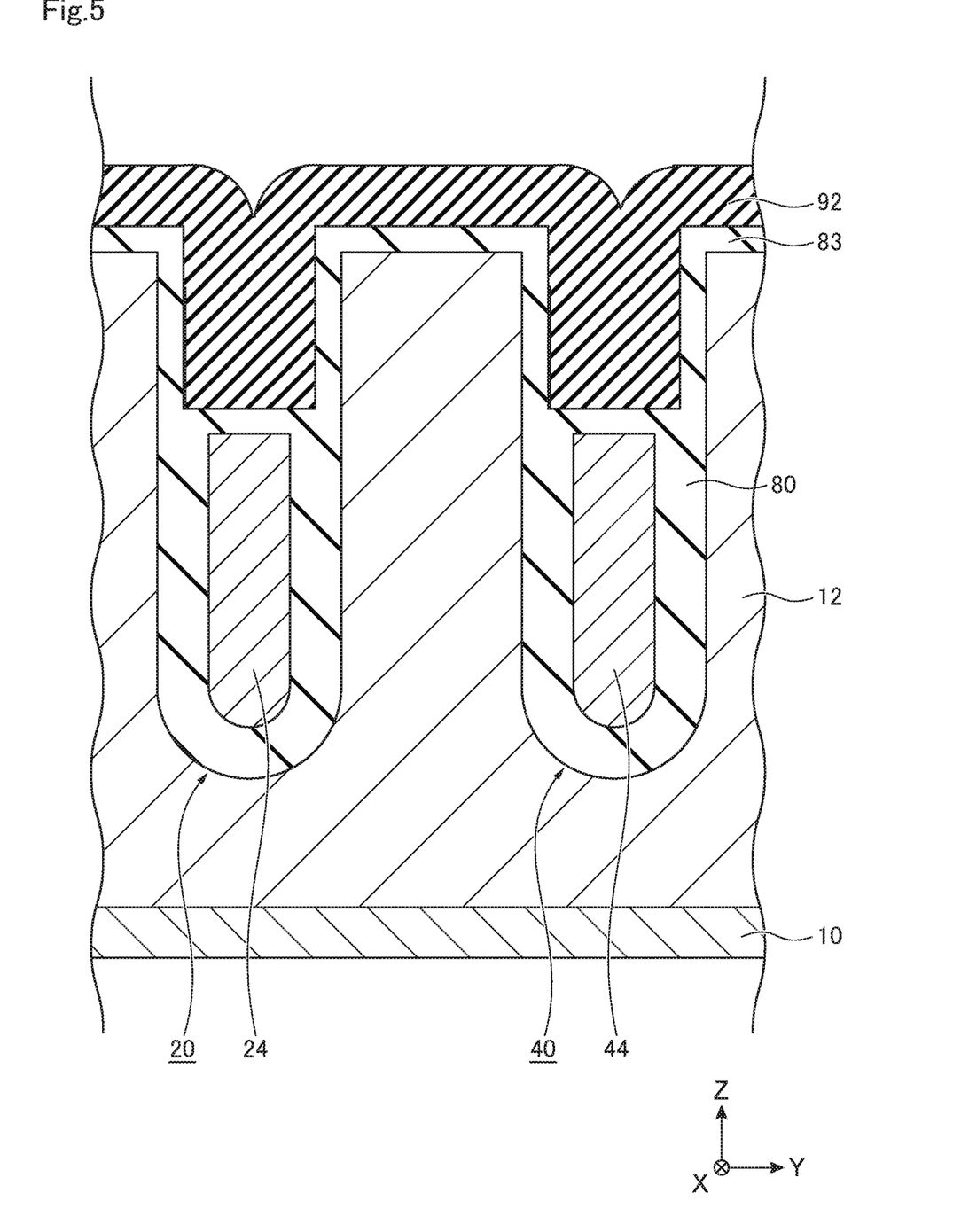
FIG. 5 is a schematic cross-sectional view illustrating the process of manufacturing the semiconductor device according to the first embodiment.

FIGS. 3 to 5 are schematic cross-sectional views illustrating a process of manufacturing the semiconductor device 100 according to the present embodiment.

First, the drift layer 12 is formed on the drain layer 10. For example, the drain layer 10 is used as a semiconductor substrate which is a Si substrate, and the drift layer 12 is formed on the drain layer 10 by epitaxial growth. However, the process of manufacturing the drain layer 10 and the drift layer 12 is not limited to the above manufacturing process. Next, the first trench 20 and the second trench 40 reaching the drift layer 12 are formed by, for example, photolithography and reactive ion etching (RIE). Next, an insulating film 80 containing, for example, SiOx is formed in the first trench 20 and in the second trench 40 on the drift layer 12 by, for example, a thermal oxidation method or CVD. Next, a conductive material 90 containing, for example, polysilicon containing impurities of conductivity type is formed on the insulating film 80 by, for example, CVD (FIG. 3). Here, the concentration of the impurities of conductivity type is preferably $1\times10^{19}$ atoms/cm$^3$ or more and $1\times10^{22}$ atoms/cm$^3$ or less.

Next, a part of the conductive material 90 is removed to form the first field plate electrode 24 in the first trench 20 by, for example, etching back. The second field plate electrode 44 is formed in the second trench (FIG. 4).

Next, a part of the insulating film 80 is removed by, for example, wet etching such that upper side surfaces and an upper surface of the first field plate electrode 24, upper side surfaces and an upper surface of the second field plate electrode 44, a side wall of the first trench 20 above the first field plate electrode 24, a side wall of the second trench 40 above the second field plate electrode 44, and a surface of the drift layer 12 are exposed. Next, an insulating film 83 containing SiOx is formed on an upper surface of the insulating film 80, the upper side surfaces and the upper surface of the first field plate electrode 24, the upper side surfaces and the upper surface of the second field plate electrode 44, the side wall of the first trench 20 above the first field plate electrode 24, the side wall of the second trench 40 above the second field plate electrode 44, and the surface of the drift layer 12 by, for example, a thermal oxidation method Next, an insulating film 92 containing SiNx is formed on the insulating film 83 by, for example, low pressure CVD (LPCVD) (FIG. 5).

Next, a part of the insulating film 92 is etched back by RIE, wet etching, or chemical dry etching (CDE). This forms the third insulating film 26 and the seventh insulating film 46. Note that the fourth insulating film 30 and the eighth insulating film 50 in the semiconductor device 110 illustrated in FIG. 2 can be formed in a similar manner to the above. A part of the insulating film 83 left on the side wall of the first trench 20 above the first field plate electrode 24 becomes the second insulating film 21. A part of the insulating film 83 left on the side wall of the second trench 40 above the second field plate electrode 44 becomes the sixth insulating film 41.

Next, the first gate electrode 28 and the second gate electrode 48 each containing a conductive material such as polysilicon containing impurities of conductivity type or metal are formed by, for example, CVD. Here, in the semiconductor device 100 illustrated in FIG. 1, the first gate electrode 28 is formed on the third insulating film 26, and the second gate electrode 48 is formed on the seventh insulating film 46. In the semiconductor device 110 illustrated in FIG. 2, the first gate electrode 28 is formed on the third insulating film 26 and the fourth insulating film 30, and the second gate electrode 48 is formed on the seventh insulating film 46 and the eighth insulating film 50. Next, the interlayer insulating film 70a and the interlayer insulating film 70b which are the interlayer insulating films 70 are formed on the first gate electrode 28 and the second gate electrode 48, respectively. Next, a part of the interlayer insulating film 70, a part of the insulating film 92, and a part of the insulating film 83 are removed by, for example, etching to form an opening for making contact with the source region 16 and the contact region 18.

Next, the base region 14, the source region 16, and the contact region 18 are formed on the drift layer 12 by, for example, an ion implantation method. Next, the drain electrode 60 is formed under the drain layer 10.

Next, the semiconductor device in the middle of manufacture, the semiconductor device having been manufactured by, for example, the above-described manufacturing process is subjected to a heat treatment for activating impurities in the base region 14, the source region 16, and the contact region 18. Next, the semiconductor device in the middle of manufacture, the semiconductor device having been subjected to, for example, the above-described heat treatment for activating impurities, is further subjected to a heat treatment for raising the temperature to, for example, about 1000° C. After that, the heat treatment is stopped, and the temperature of the semiconductor device in the middle of manufacture is lowered. Here, the temperature of the semiconductor device in the middle of manufacture is preferably lowered as rapidly as possible. The temperature of the semiconductor device in the middle of manufacture for the heat treatment is preferably raised to about 1000° C., for example, in a furnace used for rapid thermal annealing (RTA). After that, preferably, the semiconductor device in the middle of manufacture is carried out of the furnace used for RTA, and is rapidly cooled to about 600° C., for example, in about one minute. As described above, the semiconductor device 100 according to the present embodiment is obtained.

Next, a function and an effect of the present embodiment will be described.

Figure 6:
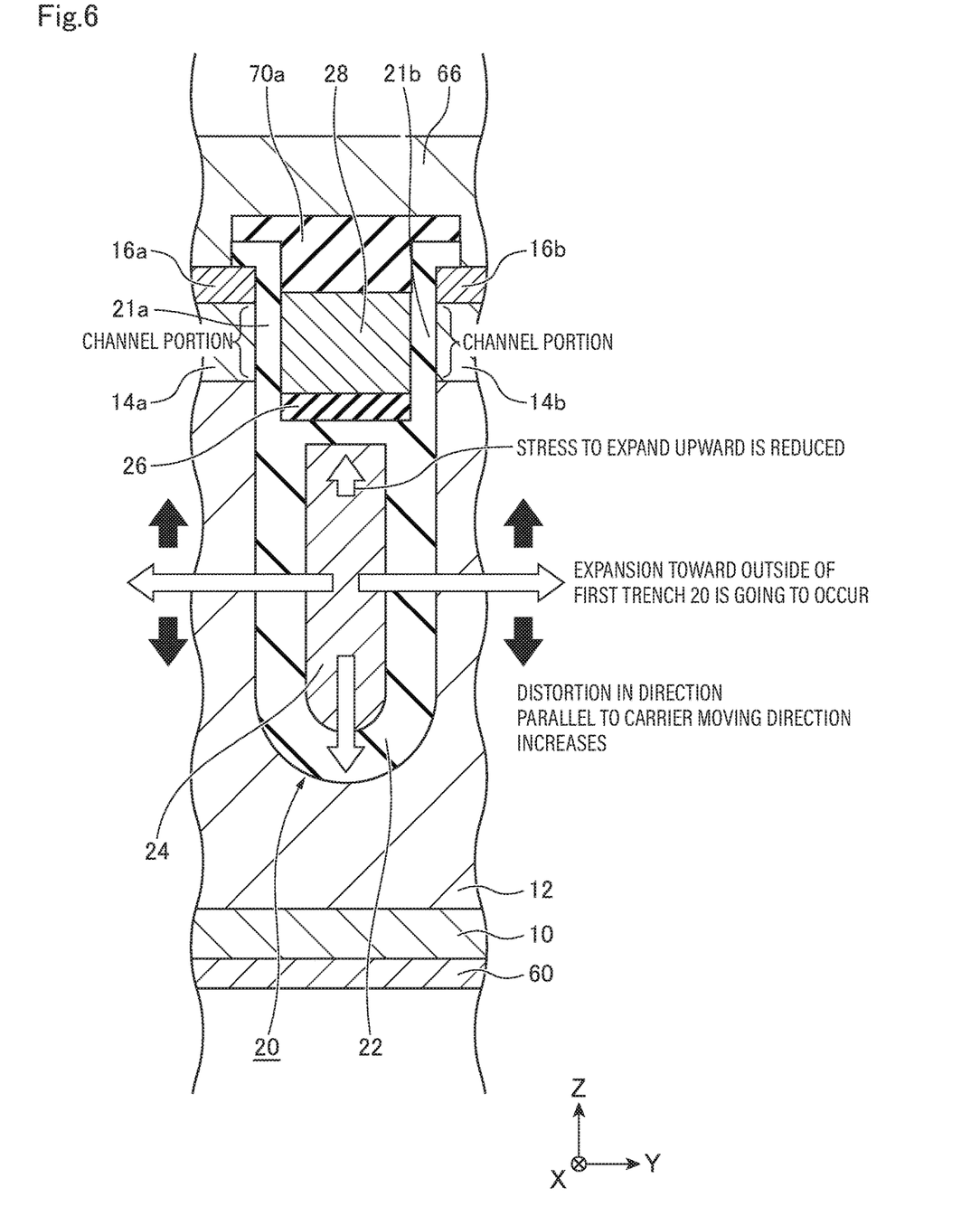
FIG. 6 is a schematic cross-sectional view for explaining a function and an effect of the semiconductor device according to the first embodiment.

FIG. 6 is a schematic cross-sectional view for explaining a function and an effect of the semiconductor device 100 according to the present embodiment.

In a MOSFET such as the semiconductor device 100, it is preferable to reduce an on-resistance. Here, for example, when carriers are electrons, it is conceivable to apply a stress in a tensile direction to a channel of the MOSFET in parallel to a direction in which carriers move. Due to such a stress, mobility of carriers increases. Therefore, an on-resistance can be reduced.

As a method for applying such a stress, a method using a compressive stress of the first insulating film 22 or the fifth insulating film 42 is conceivable. That is, if description is made by taking the first insulating film 22 as an example, the above-described stress in a tensile direction is going to be applied using a stress of expansion of the first insulating film 22 in the X direction or the Y direction, in other words, a stress of expansion of the first insulating film 22 toward the outside of the first trench 20 when the first insulating film 22 is compressed in the Z direction. For this purpose, for example, when the first insulating film 22 is formed by a thermal oxidation method, it is preferable to lower the temperature for forming the first insulating film 22 or to reduce the content of an OH group in the first insulating film 22. However, as a result, the shape of the first insulating film 22 is unintentionally changed disadvantageously. In addition, productivity of the semiconductor device decreases disadvantageously because an oxidation rate of Si used for the first insulating film 22 is lowered.

Meanwhile, it is conceivable to apply a stress in a tensile direction to a channel direction using expansion of the first field plate electrode 24 by a heat treatment performed for activating impurities of conductivity type. Specifically, by performing rapid cooling after the heat treatment, a stress of expansion of the first field plate electrode 24 in a direction parallel to the X direction or the Y direction, in other words, a stress of expansion of the first field plate electrode 24 toward the outside of the first trench 20, is retained, and the stress in the tensile direction is going to be applied to the channel direction.

Therefore, the semiconductor device 100 according to the present embodiment includes the third insulating film 26 provided between the first field plate electrode 24 and the first gate electrode 28, the third insulating film 26 containing silicon nitride. Silicon nitride has a large bulk modulus. Silicon nitride is stable in view of mechanical structure. Therefore, by providing the third insulating film 26 containing silicon nitride, the first field plate electrode 24 does not expand much upward in FIG. 6, and expands more in a direction parallel to the X direction or the Y direction, in other words, toward the outside of the first trench 20. As a result, a larger stress in the tensile direction is applied to the channel direction. This makes it possible to provide a semiconductor device having an on-resistance reduced.

As described above, in order to retain the stress of expansion of the first field plate electrode 24 toward the outside of the first trench 20, it is preferable to rapidly cool the first field plate electrode 24 after the heat treatment because a state in which the first field plate electrode 24 expands can be maintained. The polysilicon contained in the first field plate electrode 24 preferably contains impurities of conductivity type at a concentration of $1\times10^{19}$ atoms/cm$^3$ or more and $1\times10^{22}$ atoms/cm$^3$ or less in order to increase the stress of expansion.

The third insulating film 26 preferably has a film thickness of 10 nm or more. This is because when the film thickness is less than 10 nm, the film thickness of the third insulating film 26 is too small, and therefore a stress generated by upward expansion of the first field plate electrode 24 cannot be sufficiently suppressed.

The third insulating film 26 is preferably formed by an LPCVD method. In the case of the LPCVD method, the third insulating film 26 is formed at a relatively high temperature of 700° C. or higher and 800° C. or lower. In this case, the hydrogen concentration in the third insulating film 26 is relatively low. Meanwhile, when third insulating film 26 is formed by a plasma CVD method, the third insulating film 26 is formed at a relatively low temperature of, for example, 300° C. or higher and 400° C. or lower. In this case, the hydrogen concentration in the third insulating film 26 is relatively high. Hydrogen contained in the third insulating film 26 contained in this way may go out of the third insulating film 26 in, for example, a heat treatment for activating impurities at a temperature higher than the formation temperature or a heat treatment in a reliability test of the semiconductor device 100. In this case, a threshold value of the semiconductor device 100 changes disadvantageously. A film formed by the LPCVD method is superior to a film formed by the plasma CVD method in coverage. Therefore, the third insulating film 26 is preferably formed by the LPCVD method.

By providing the fourth insulating film 30 containing SiOx between the first gate electrode 28 and the third insulating film 26, formation of a level at which carriers are trapped is suppressed between polysilicon in the first gate electrode 28 and SiNx in the third insulating film 26.

The semiconductor device according to the present embodiment can provide a semiconductor device having a low on-resistance.

Second Embodiment

A semiconductor device according to the present embodiment is different from the semiconductor device according to the first embodiment in that a gate electrode includes: a first portion; a second portion provided between a field plate electrode and a first semiconductor region below the first portion, the second portion being electrically connected to the first portion; and a third portion provided between the field plate electrode and a second semiconductor region below the first portion, the third portion being electrically connected to the first portion. In addition, the semiconductor device according to the present embodiment is different from the semiconductor device according to the first embodiment in that a third insulating film is provided on a lower surface of the first portion, an inner surface of the second portion, and an inner surface of the third portion. Here, description of contents overlapping with those of the semiconductor device according to the first embodiment is omitted.

Figure 7:
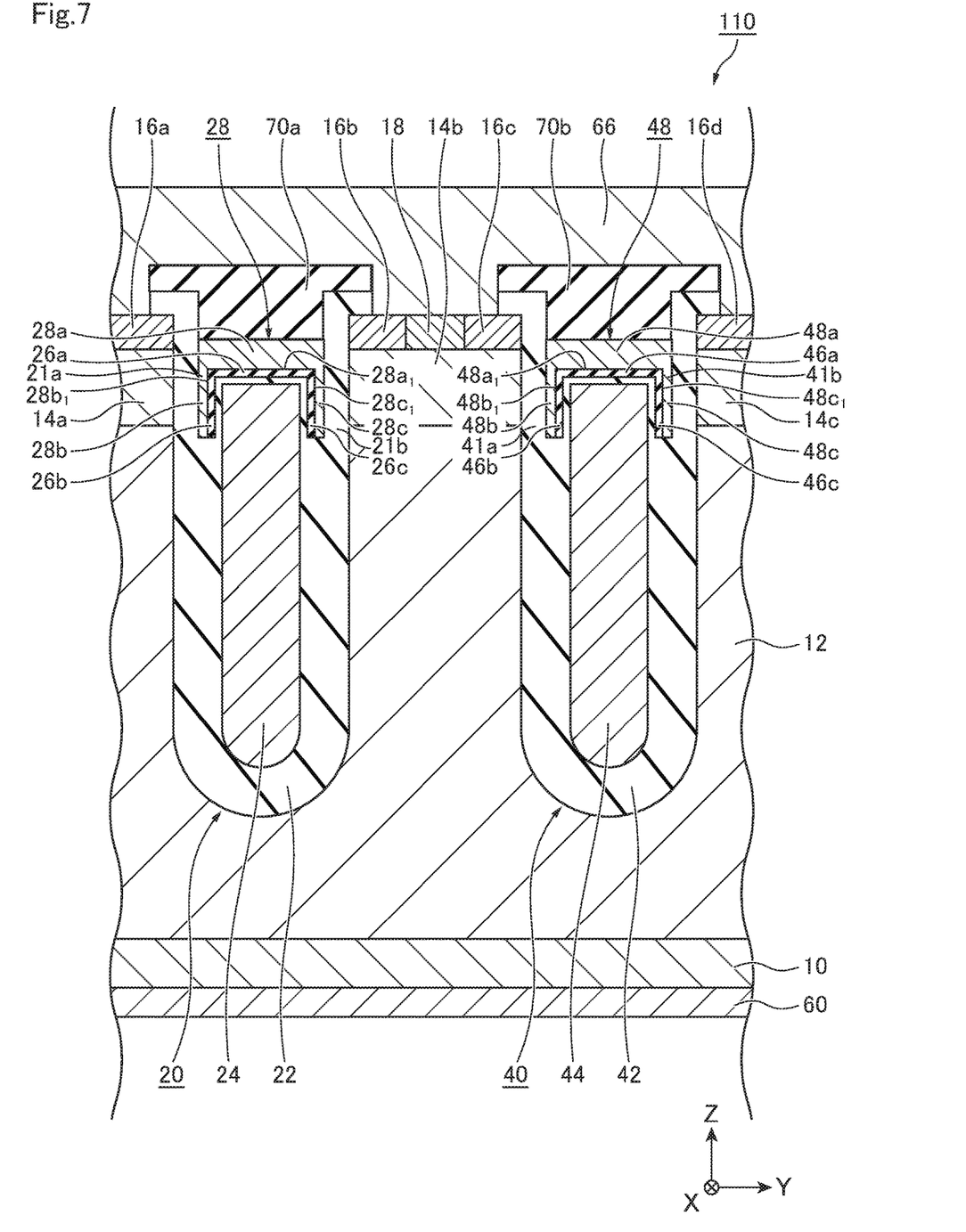
FIG. 7 is a schematic cross-sectional view of a semiconductor device according to a second embodiment.

FIG. 7 is a schematic cross-sectional view of a semiconductor device 110 according to the present embodiment.

A first gate electrode 28 has a first portion 28a, a second portion 28b, and a third portion 28c. The first portion 28a is provided between a first field plate electrode 24 and an interlayer insulating film 70a. The second portion 28b is provided between the first field plate electrode 24 and a base region 14a below the first portion 28a. The second portion 28b is electrically connected to the first portion 28a. The third portion 28c is provided between the first field plate electrode 24 and the base region 14b below the first portion 28a. The third portion 28c is electrically connected to the first portion 28a.

For example, the first gate electrode 28 preferably has an inverted u shape formed with the first portion 28a, the second portion 28b, and the third portion 28c in a case of a device having a particularly high breakdown voltage.

A third insulating film 26 has a third insulating film 26a in contact with a lower surface 28$a_1$ of the first portion, a third insulating film 26b in contact with an inner surface 28$b_1$ of the second portion, and a third insulating film 26c in contact with an inner surface 28$c_1$ of the third portion.

Similarly, a second gate electrode 48 has a fourth portion 48a, a fifth portion 48b, and a sixth portion 48c. The fourth portion 48a is provided between a second field plate electrode 44 and an interlayer insulating film 70b. The fifth portion 48b is provided between the second field plate electrode 44 and the base region 14b below the fourth portion 48a. The fifth portion 48b is electrically connected to the fourth portion 48a. The sixth portion 48c is provided between the second field plate electrode 44 and the base region 14c below the fourth portion 48a. The sixth portion 48c is electrically connected to the fourth portion 48a.

For example, the second gate electrode 48 preferably has an inverted u shape formed with the fourth portion 48a, the fifth portion 48b, and the sixth portion 48c in a case of a device having a particularly high breakdown voltage.

The seventh insulating film 46 is provided in contact with a lower surface 48$a_1$ of the fourth portion, an inner surface 48$b_1$ of the fifth portion, and an inner surface 48$c_1$ of the sixth portion.

In a semiconductor device having a relatively high breakdown voltage, since the opening size of each of a first trench 20 and a second trench 40 is large, the film thickness of each of the first gate electrode 28 and the second gate electrode 48 required to fill the trenches is extremely large. Therefore, a load on the device for forming the gate electrodes is large. Meanwhile, in the case of the first gate electrode 28 and the second gate electrode 48 each having an inverted u shape as in the present embodiment, the first gate electrode 28 and the second gate electrode 48 are formed also on the basis of the second portion 28b, the third portion 28c, the fifth portion 48b, and the sixth portion 48c. Therefore, a gate electrode having a small film thickness can also be formed, which is advantageous.

Figure 8:
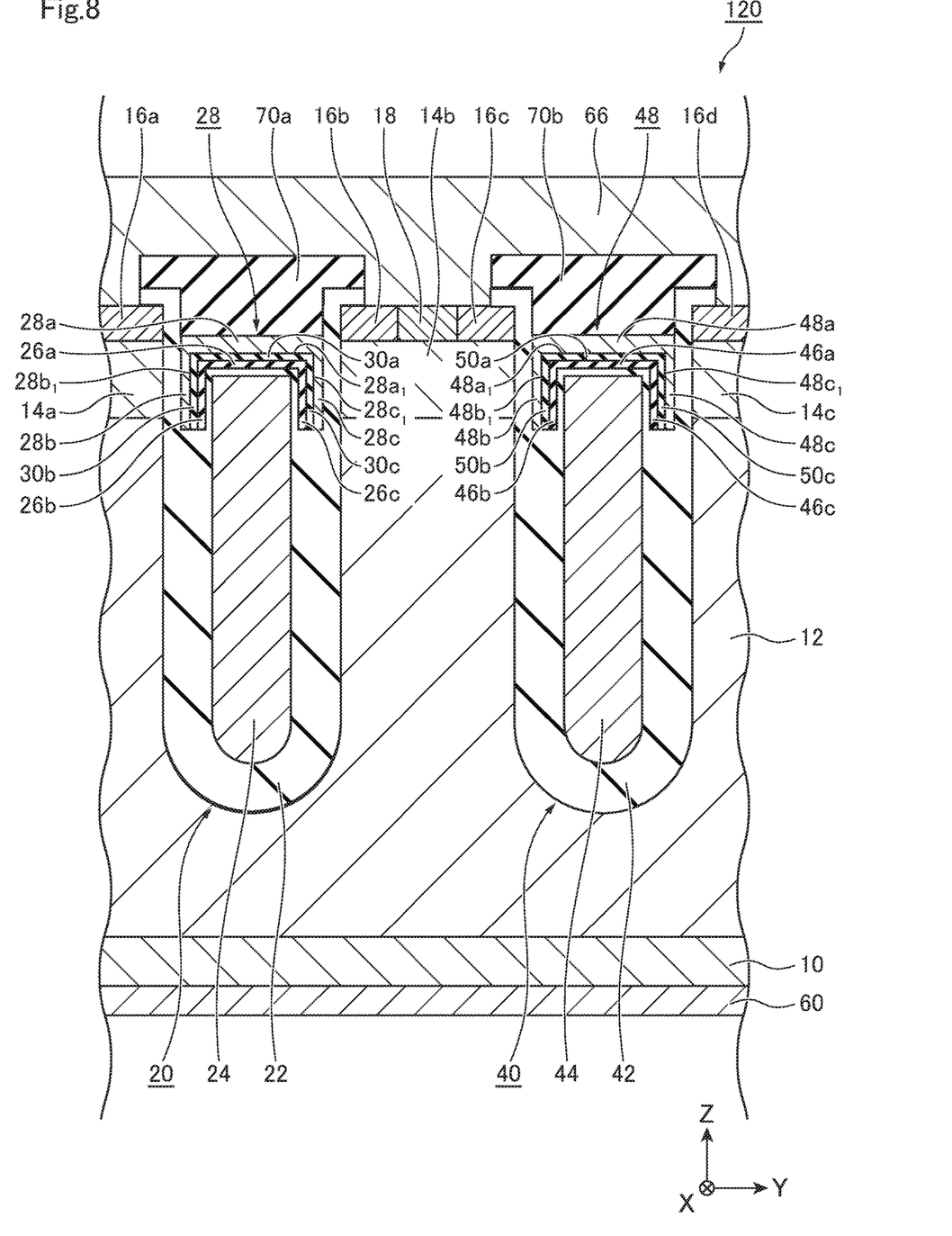
FIG. 8 is a schematic cross-sectional view of a semiconductor device according to another aspect of the second embodiment.

FIG. 8 is a schematic cross-sectional view of a semiconductor device 120 according to another aspect of the present embodiment. A fourth insulating film 30a is provided between the lower surface 28$a_1$ of the first portion and the third insulating film 26a. A fourth insulating film 30b is provided between the inner surface 28$b_1$ of the second portion and the third insulating film 26b. A fourth insulating film 30c is provided between the inner surface 28$c_1$ of the third portion and the third insulating film 26c. An eighth insulating film 50a is provided between the lower surface 48$a_1$ of the fourth portion and the seventh insulating film 46a. An eighth insulating film 50b is provided between the inner surface 48$b_1$ of the fifth portion and the seventh insulating film 46b. An eighth insulating film 50c is provided between the inner surface 48$c_1$ of the sixth portion and the seventh insulating film 46c. By providing the fourth insulating film 30 and the eighth insulating film 50 in this way, formation of a level at which carriers are trapped is suppressed between polysilicon and SiNx.

The semiconductor device according to the present embodiment can also provide a semiconductor device having a low on-resistance.

Third Embodiment

A semiconductor device according to the present embodiment is different from the semiconductor devices according to the first and second embodiments in that a third insulating film is further provided on an outer surface of a gate electrode. Here, description of contents overlapping with the first and second embodiments is omitted.

Figure 9:
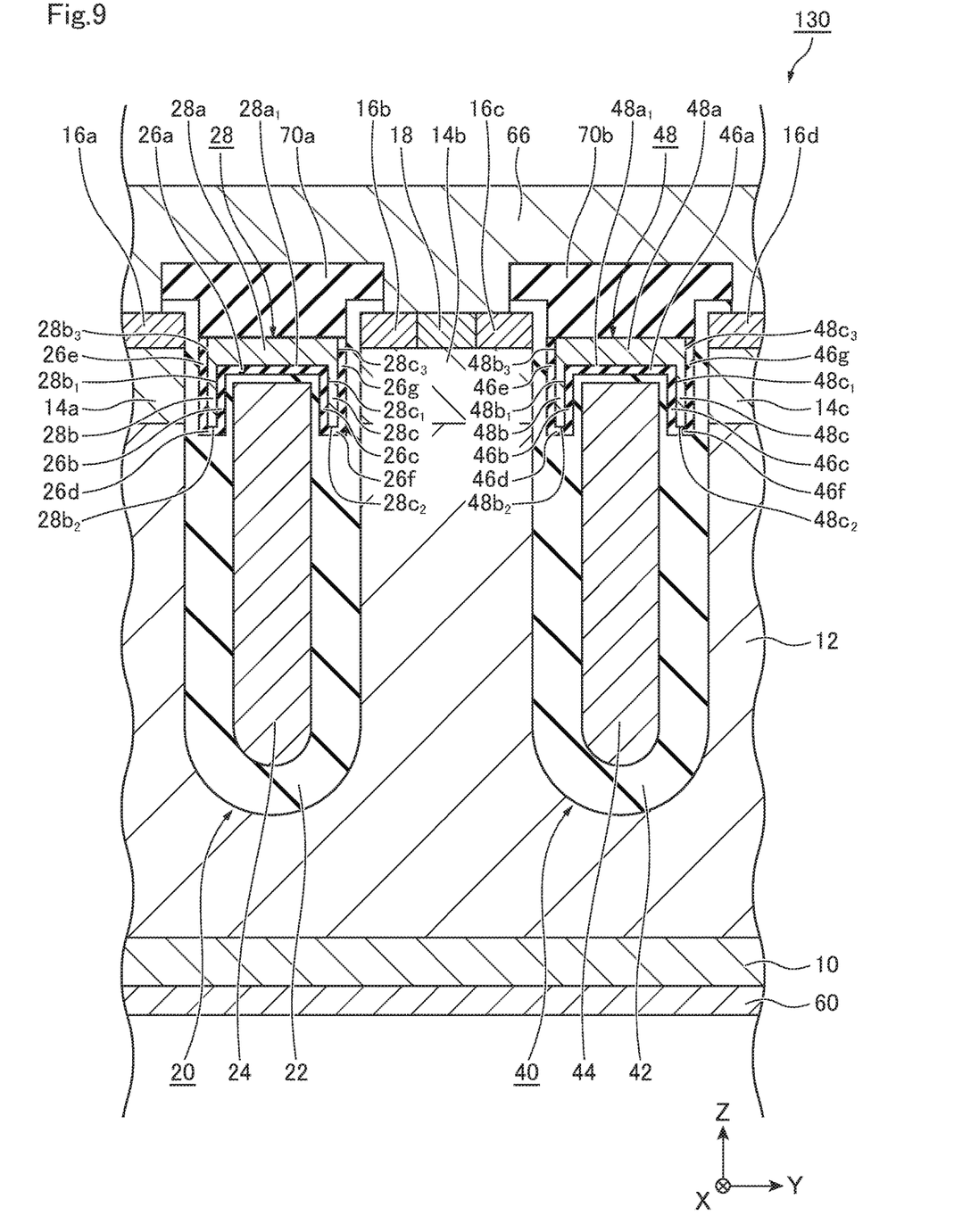
FIG. 9 is a schematic cross-sectional view of a semiconductor device according to a third embodiment.

FIG. 9 is a schematic cross-sectional view of a semiconductor device 130 according to the present embodiment. A third insulating film 26d is provided in contact with a lower surface $28b_2$ of a second portion. A third insulating film $26e$ is provided in contact with an outer surface $28b_3$ of a first gate electrode. A third insulating film $26f$ is provided in contact with a lower surface $28c_2$ of a third portion. A third insulating film $26g$ is provided in contact with an outer surface $28c_3$ of the first gate electrode. A seventh insulating film $46d$ is provided in contact with a lower surface $48b_2$ of a fifth portion. A seventh insulating film $46e$ is provided in contact with an outer surface $48b_3$ of a second gate electrode 48. A seventh insulating film $46f$ is provided in contact with a lower surface $48c_2$ of a sixth portion. A seventh insulating film $46g$ is provided in contact with an outer surface $48c_3$ of the second gate electrode 48.

Figure 10:
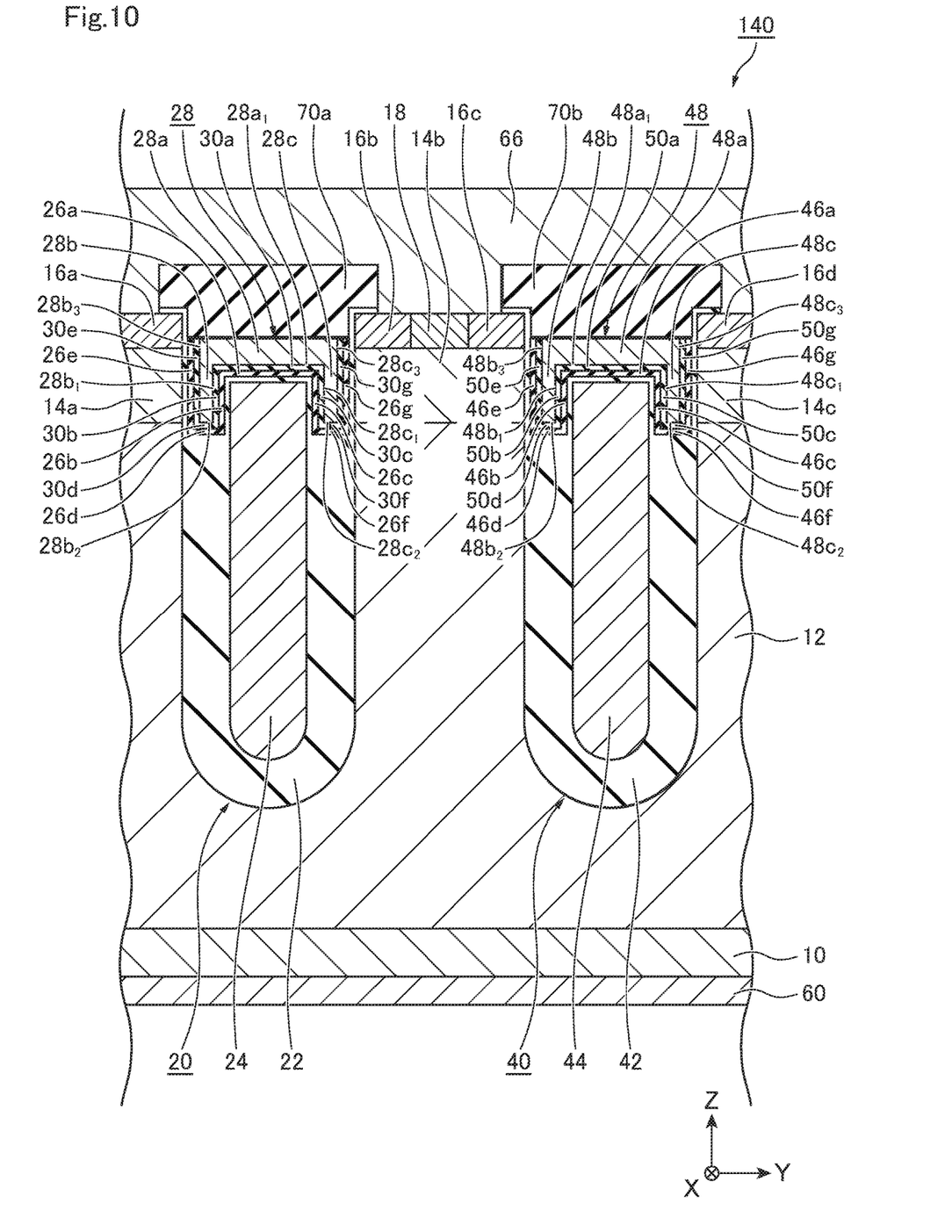
FIG. 10 is a schematic cross-sectional view of a semiconductor device according to another aspect of the third embodiment.

FIG. 10 is a schematic cross-sectional view of a semiconductor device 140 according to another aspect of the present embodiment. A fourth insulating film $30d$ is provided between the third insulating film $26d$ and the lower surface $28b_2$ of the second portion. A fourth insulating film $30e$ is provided between the third insulating film $26e$ and the outer surface $28b_3$ of the first gate electrode. A fourth insulating film $30f$ is provided between the third insulating film $26f$ and the lower surface $28c_2$ of the third portion. A fourth insulating film $30g$ is provided between the third insulating film $26g$ and the outer surface $28c_3$ of the first gate electrode. An eighth insulating film $50d$ is provided between the seventh insulating film $46d$ and the lower surface $48b_2$ of the fifth portion. An eighth insulating film $50e$ is provided between the seventh insulating film $46e$ and the outer surface $48b_3$ of the second gate electrode. An eighth insulating film $50f$ is provided between the seventh insulating film $46f$ and the lower surface $48c_2$ of the sixth portion. An eighth insulating film $50g$ is provided between the seventh insulating film $46g$ and the outer surface $48c_3$ of the second gate electrode. By providing the fourth insulating film 30 and the eighth insulating film 50 in this way, formation of a level at which carriers are trapped is suppressed between polysilicon and SiNx.

Each of the third insulating film 26 and the seventh insulating film 46 in the semiconductor devices 130 and 140 according to the present embodiment preferably has a film thickness of 50 nm or less. This is because when the film thickness is larger than 50 nm, the film thickness of a gate insulating film in the vicinity of a channel of the MOSFET is large, and therefore a threshold voltage of the MOSFET is too high.

The semiconductor device according to the present embodiment can also provide a semiconductor device having a low on-resistance.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first electrode;
    a first semiconductor layer of first conductivity type provided on the first electrode;
    a second semiconductor layer of first conductivity type provided on the first semiconductor layer;
    a first semiconductor region of second conductivity type provided on the second semiconductor layer;
    a second semiconductor region of second conductivity type provided on the second semiconductor layer;
    a first insulating film provided in a trench between the first semiconductor region and the second semiconductor region, the trench reaching the second semiconductor layer from above the first semiconductor region and the second semiconductor region, the first insulating film containing silicon oxide;
    a second electrode provided in the trench, the second electrode facing the second semiconductor layer via the first insulating film, the second electrode containing polysilicon;
    a third electrode provided above the second electrode, the third electrode facing the first semiconductor region and the second semiconductor region via a second insulating film containing silicon oxide;
    a third insulating film provided between the second electrode and the third electrode, the third insulating film containing silicon nitride;
    a third semiconductor region of first conductivity type provided on the first semiconductor region;
    a fourth semiconductor region of first conductivity type provided on the second semiconductor region;
    an interlayer insulating film provided on the third electrode; and
    a fourth electrode provided on the interlayer insulating film, the fourth electrode being electrically connected to the third semiconductor region and the fourth semiconductor region.

2. The semiconductor device according to claim 1, wherein the third electrode has:
    a first portion provided between the second electrode and the interlayer insulating film;
    a second portion provided between the second electrode and the first semiconductor region, the second portion being provided below the first portion, the second portion being electrically connected to the first portion; and
    a third portion provided between the second electrode and the second semiconductor region, the third portion being provided below the first portion, the third portion being electrically connected to the first portion.

3. The semiconductor device according to claim 2, wherein the third electrode has an inverted u shape formed with the first portion, the second portion, and the third portion.

4. The semiconductor device according to claim 2, wherein the third insulating film is provided on a lower surface of the first portion, an inner surface of the second portion, and an inner surface of the third portion.

5. The semiconductor device according to claim 4, wherein the third insulating film is further provided between the first portion and the first semiconductor region and between the second portion and the second semiconductor region.

6. The semiconductor device according to claim 5, wherein the third insulating film has a film thickness of 50 nm or less.

7. The semiconductor device according to claim 1, further comprising a fourth insulating film provided between the third electrode and the third insulating film, the fourth insulating film containing silicon oxide.

8. The semiconductor device according to claim 7, wherein the third electrode has:
   a first portion provided between the second electrode and the interlayer insulating film;
   a second portion provided between the second electrode and the first semiconductor region, the second portion being provided below the first portion, the second portion being electrically connected to the first portion; and
   a third portion provided between the second electrode and the second semiconductor region, the third portion being provided below the first portion, the third portion being electrically connected to the first portion,
   the third insulating film is provided on a lower surface of the first portion, an inner surface of the second portion, and an inner surface of the third portion, and
   the fourth insulating film is provided between the third insulating film provided on a lower surface of the first portion and the first portion, between the third insulating film provided on an inner surface of the second portion and the second portion, and between the third insulating film provided on an inner surface of the third portion and the third portion.

9. The semiconductor device according to claim 8, wherein
   the third insulating film is further provided between the first portion and the first semiconductor region and between the second portion and the second semiconductor region, and
   the fourth insulating film is provided between the first semiconductor region and the third insulating film provided between the first portion and the first semiconductor region, and between the second semiconductor region and the third insulating film provided between the second portion and the second semiconductor region.

10. The semiconductor device according to claim 1, wherein the third insulating film has a film thickness of 10 nm or more.

11. The semiconductor device according to claim 1, wherein the polysilicon contains impurities of conductivity type at a concentration of $1 \times 10^{19}$ atoms/cm$^3$ or more and $1 \times 10^{21}$ atoms/cm$^3$ or less.

* * * * *